US012813215B2

(12) United States Patent
Hotta et al.

(10) Patent No.: US 12,813,215 B2
(45) Date of Patent: Nov. 24, 2026

(54) SINTERED ALUMINA MATERIAL AND ELECTROSTATIC CHUCK

(71) Applicant: Niterra Co., Ltd., Nagoya (JP)

(72) Inventors: Motoki Hotta, Nagoya (JP); Hideo Tange, Nagoya (JP); Shinji Yuri, Nagoya (JP); Yusuke Katsu, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 136 days.

(21) Appl. No.: 18/788,944

(22) Filed: Jul. 30, 2024

(65) Prior Publication Data

US 2025/0046641 A1 Feb. 6, 2025

(30) Foreign Application Priority Data

Aug. 3, 2023 (JP) ................................ 2023-126801
Jun. 18, 2024 (JP) ................................ 2024-097826

(51) Int. Cl.
*H10P 72/72* (2026.01)
*C04B 35/111* (2006.01)
*H01J 37/32* (2006.01)

(52) U.S. Cl.
CPC .......... *H10P 72/722* (2026.01); *C04B 35/111* (2013.01); *H01J 37/32715* (2013.01); *H01J 2237/2007* (2013.01)

(58) Field of Classification Search
CPC . H01L 21/683; H01L 21/6833; C04B 35/111; C04B 2235/3208; C04B 2235/77; C04B 35/645; C04B 2235/3225; H01J 37/32; H01J 37/32715; H01J 2237/2007; H10P 72/722; H10P 72/72
USPC .......................................................... 361/234
See application file for complete search history.

(56) References Cited

U.S. PATENT DOCUMENTS

| | | | |
|---|---|---|---|
| 7,416,793 B2 | 8/2008 | Matsuda et al. | |
| 2005/0152089 A1 | 7/2005 | Matsuda et al. | |
| 2008/0049374 A1 | 2/2008 | Morioka et al. | |
| 2023/0357088 A1* | 11/2023 | Nawata | C04B 35/185 |
| 2024/0409468 A1 | 12/2024 | Hotta et al. | |
| 2024/0429031 A1* | 12/2024 | Sato | H01J 37/32715 |

FOREIGN PATENT DOCUMENTS

| | | |
|---|---|---|
| JP | 2005-112635 A | 4/2005 |
| JP | 2005210077 A | 8/2005 |
| JP | 2008053316 A1 | 3/2008 |
| JP | 4744855 B2 | 8/2011 |
| JP | 2021-93488 A | 6/2021 |
| WO | 2016121286 A1 | 8/2016 |
| WO | 2023068159 A1 | 4/2023 |

OTHER PUBLICATIONS

Japan Patent Office, Office Action (Notice of Reasons for Refusal) issued in corresponding Application No. 2024-097826 issued Jul. 8, 2025.

* cited by examiner

*Primary Examiner* — Danny Nguyen
(74) *Attorney, Agent, or Firm* — Stites & Harbison PLLC; Jeffrey A. Haeberlin; Wanli Wu

(57) ABSTRACT

Provided is a technology for suppressing production of particles in an alumina-based sintered body. The alumina-based sintered body contains not smaller than 90 ppm and not greater than 265 ppm of yttrium (Y), and not greater than 100 ppm of calcium (Ca), and an average grain size of alumina crystal grains is not greater than 6 μm.

8 Claims, 8 Drawing Sheets

Fig. 2

| No. | Y ADDITION AMOUNT (ppm) | FIRING TEMPERATURE, PERIOD | SINTERING DENSITY (g/cm3) | AVERAGE GRAIN SIZE (μm) | Ca AMOUNT (ppm) | Ca-YPHASE (CONFIRMED BY SEM) | YAG PHASE (CONFIRMED BY XRD) |
|---|---|---|---|---|---|---|---|
| 1 | 87 | 1550°C·4h | 3.98 | 4.8 | 42 | ABSENT | ABSENT |
| 2 | 174 | 1550°C·4h | 3.99 | 5.1 | 55 | ABSENT | ABSENT |
| 3 | 174 | 1525°C·4h | 3.98 | 4.9 | 51 | ABSENT | ABSENT |
| 4 | 174 | 1550°C·4h | 3.98 | 5.1 | 56 | ABSENT | ABSENT |
| 5 | 174 | 1575°C·4h | 3.97 | 5.6 | 49 | ABSENT | ABSENT |
| 6 | 174 | 1600°C·4h | 3.97 | 5.9 | 51 | ABSENT | ABSENT |
| 7 | 174 | 1625°C·4h | 3.99 | 6.0 | 58 | ABSENT | ABSENT |
| 8 | 174 | 1625°C·12h | 3.99 | 7.5 | 51 | ABSENT | PRESENT |
| 9 | 209 | 1550°C·4h | 3.98 | 5.2 | 49 | ABSENT | ABSENT |
| 10 | 261 | 1550°C·4h | 3.99 | 5.1 | 55 | ABSENT | ABSENT |
| 11 | 348 | 1550°C·4h | 3.98 | 5.3 | 53 | ABSENT | PRESENT |
| 12 | 174 | 1550°C·4h | 3.99 | 5.0 | 46 | ABSENT | ABSENT |
| 13 | 174 | 1550°C·4h | 3.99 | 5.3 | 103 | PRESENT | ABSENT |
| 14 | 174 | 1550°C·4h | 3.99 | 7.2 | 175 | PRESENT | PRESENT |
| 15 | 820 | 1600°C·4h | 3.98 | 6.2 | 49 | ABSENT | PRESENT |
| 16 | 174 | 1300°C4h | 3.97 | 1.1 | 47 | ABSENT | ABSENT |
| 17 | 174 | 1450°C4h | 3.97 | 2.2 | 56 | ABSENT | ABSENT |
| 18 | 174 | 1490°C4h | 3.97 | 3.5 | 53 | ABSENT | ABSENT |

SAMPLE 4

SURFACE

100

SAMPLE 13

SURFACE

FRACTURE CROSS-SECTION

SAMPLE 15

SURFACE

FRACTURE CROSS-SECTION

| | mol% |
|---|---|
| Mg | 1.9 |
| Al | 92.9 |
| Ca | 3.0 |
| Y | 2.2 |

Fig.4A CHANNELING CONTRAST IMAGES
SAMPLE 7 (4 HOURS) SAMPLE 8 (12 HOURS)
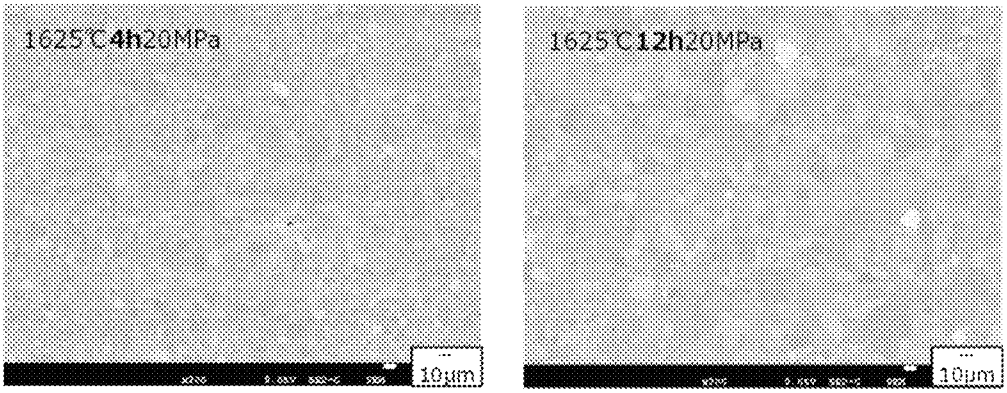
Fig.4B XRD
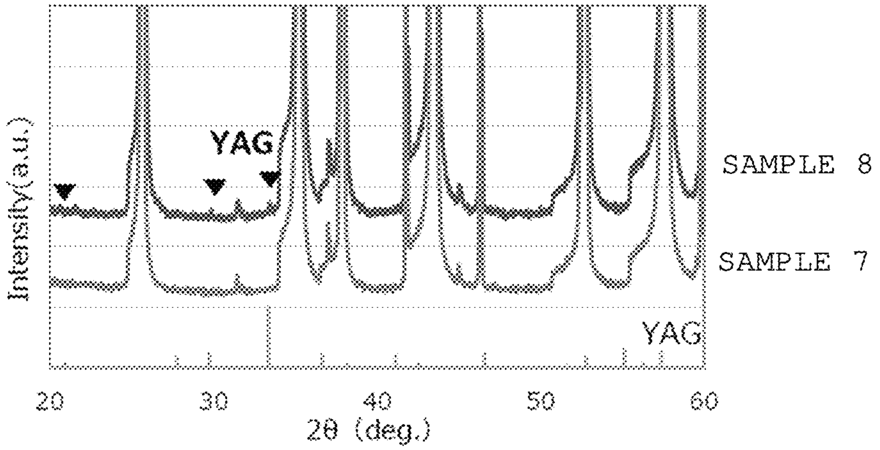

Fig. 6A SAMPLE 4
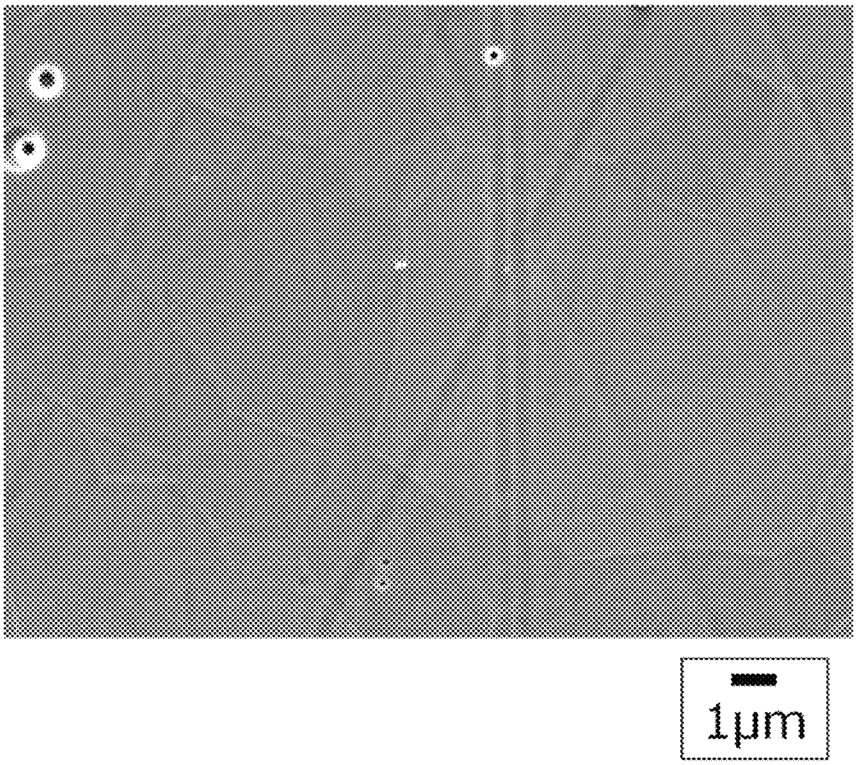
Fig. 6B SAMPLE 15
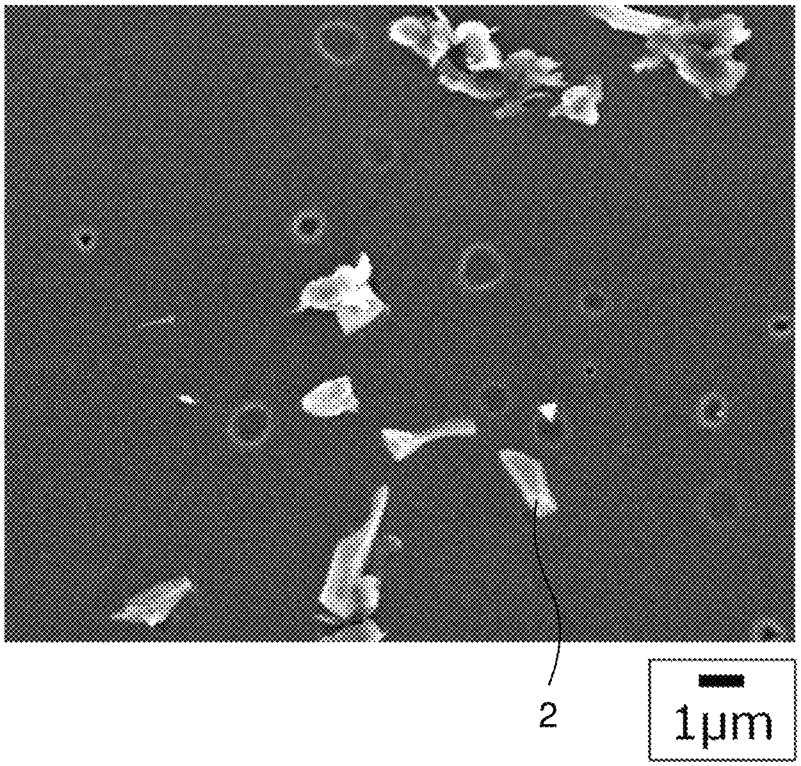

SINTERED ALUMINA MATERIAL AND ELECTROSTATIC CHUCK

CROSS-REFERENCE TO RELATED APPLICATIONS

Priority is claimed on Japanese application No. 2023-126801, filed Aug. 3, 2023, and Japanese application No. 2024-097826, filed Jun. 18, 2024, the content of which is incorporated herein by reference.

TECHNICAL FIELD

The present disclosure relates to an alumina-based sintered body and an electrostatic chuck.

BACKGROUND ART

As semiconductors are densified, requirements for suppression of dust (particles) production with respect to ceramic members are becoming severer. In many cases, particles from ceramic are due to particle shedding, and there are methods of adding grain boundary strengthening elements for suppressing particle shedding (see, for example, Patent Documents 1 and 2).

PRIOR ART DOCUMENT

Patent Document

Patent Document 1: Japanese Patent No. 4744855

Patent Document 2: Japanese Patent Application Laid-Open (kokai) No. 2021-093488

SUMMARY OF THE INVENTION

Problem to be Solved by the Invention

However, if a phase having a composition different from a base material is present in ceramic, only this layer is formed in a projecting state due to difference in the etch rate during plasma irradiation and this part might become a particle when coming off the base material.

The present disclosure has been made to solve the above problems and an object of the present disclosure is to provide a technology for suppressing production of particles in an alumina-based sintered body.

Means for Solving the Problem

The present disclosure has been made to solve at least one of the above problems and can be implemented as the following aspects.

(1) One aspect of the present disclosure provides an alumina-based sintered body containing $Al_2O_3$ as a main component. The alumina-based sintered body contains not smaller than 90 ppm and not greater than 265 ppm of yttrium (Y), and not greater than 100 ppm of calcium (Ca), and an average grain size of alumina crystal grains is not greater than 6 μm.

According to the alumina-based sintered body of the above aspect, since yttrium is added, alumina grain boundaries can be strengthened. In addition, since the calcium concentration in the alumina-based sintered body is small, deposition of a secondary phase containing calcium and yttrium can be suppressed. Further, since the average grain size of alumina crystal grains is controlled to be not greater than 6 μm, deposition of a secondary phase can be suppressed. From these results, the alumina-based sintered body of the above aspect can suppress production of particles.

(2) In the alumina-based sintered body of the above aspect, in a measurement result by an X-ray diffraction method for the alumina-based sintered body, there may be no peak corresponding to a interplanar spacing of 2.6 Å to 2.9 Å. According to the alumina-based sintered body of the above aspect, YAG ($Y_3Al_5O_{12}$: yttrium aluminum garnet) is hardly deposited at a grain boundary triple point and thus production of particles can be suppressed.

(3) In the alumina-based sintered body of the above aspect, when a surface of the alumina-based sintered body is observed in an area of 1.2 $mm^2$ by a scanning electron microscope, a phase containing calcium (Ca) and yttrium (Y) and having an area of not smaller than 10 $μm^2$ may be present at not more than one location. According to the alumina-based sintered body of the above aspect, a phase containing calcium (Ca) and yttrium (Y) is not detected and deposition of a secondary phase is suppressed. Thus, production of particles can be suppressed.

(4) In the alumina-based sintered body of the above aspect, a density of the alumina-based sintered body is not smaller than 3.96 $g/cm^3$. In this case, the number of pores (voids) is small and thus production of particles can be suppressed.

(5) Another aspect of the present disclosure provides an electrostatic chuck for retaining a target. The electrostatic chuck includes: a plate-shaped first layer having a first surface at which the target is to be placed, and a second surface which is a surface opposite to the first surface; and a plate-shaped second layer having a chuck electrode therein and provided on the second surface side of the first layer. At least a part of the first surface of the first layer is formed by the alumina-based sintered body in accordance with the above aspect.

According to the electrostatic chuck of the above aspect, since at least a part of the first surface at which a target is to be placed is formed by the alumina-based sintered body of the above aspect, deposition of a secondary phase is suppressed in at least the part of the first surface. Thus, production of particles can be suppressed when the first surface of the electrostatic chuck is irradiated with plasma.

The present disclosure can be implemented in various aspects. For example, the present disclosure can be implemented in aspects such as a semiconductor-manufacturing-apparatus member, a semiconductor manufacturing apparatus, a retention apparatus, an electrostatic chuck, apparatuses including these, and a manufacturing method for a semiconductor-manufacturing-apparatus member.

BRIEF DESCRIPTION OF THE DRAWINGS

FIG. 2 Table showing an evaluation result of Examples.

FIG. 4A Views showing SEM images of sample 7 and 8.

FIG. 4B Views showing results of XRD of the sample 7 and 8.

FIG. 6A Views showing a SEM image of the sample 4 after plasma irradiation.

FIG. 6B Views showing a SEM image of the sample 15 after plasma irradiation.

MODES FOR CARRYING OUT THE INVENTION

First Embodiment

Figure 1:
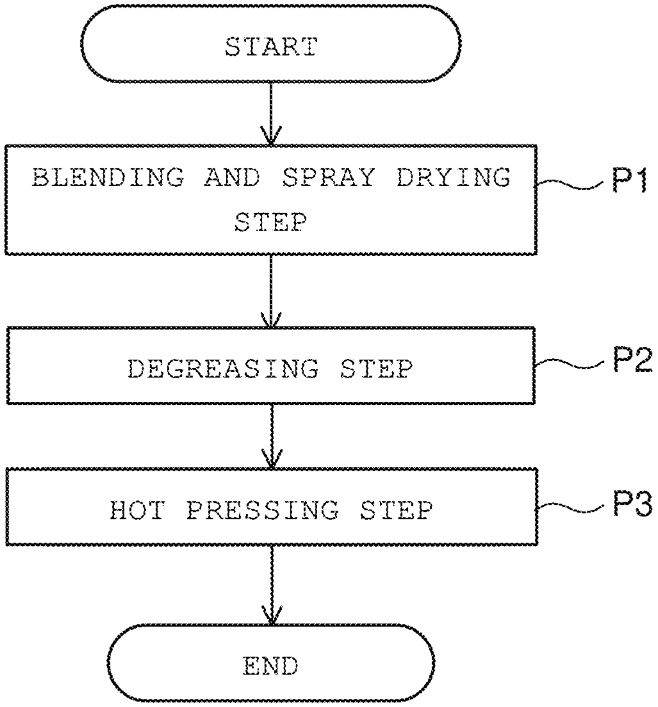
FIG. 1 Process diagram showing a manufacturing method for the alumina-based sintered body.

An alumina-based sintered body according to a first embodiment of the present disclosure contains alumina ($Al_2O_3$) as a main component, contains not smaller than 90 ppm and not greater than 265 ppm of yttrium (Y), and not greater than 100 ppm of calcium (Ca), and an average grain size of alumina crystal grains is not greater than 6 μm. A lower limit of the average grain size of alumina crystal grains is not particularly limited, but is preferably not smaller than 0.5 μm. Preferably, the alumina-based sintered body does not contain calcium. However, there is a high possibility that calcium is mixed as an impurity, and in the alumina-based sintered body of the present embodiment, the content of calcium is controlled to be not greater than 100 ppm, as described above.

The contents of yttrium and calcium can be calculated as follows. For the alumina-based sintered body, elemental analysis is performed by high-frequency inductively coupled plasma (ICP) optical emission spectrometry, to determine the amounts of yttrium and calcium. Since there are sampling variations in measurement, the average value of 5 or more measurements is used.

In the alumina-based sintered body, by adding yttrium, alumina grain boundaries can be strengthened, i.e., bond between alumina crystal grains is strengthened (bonding force is increased), whereby particle shedding can be suppressed. Gadolinium (Gd) also has an effect of strengthening grain boundaries, but adding yttrium increases the dielectric strength as compared to a case of adding gadolinium, and thus is preferable.

In the alumina-based sintered body, if calcium is contained, a phase (secondary phase) containing calcium and yttrium is deposited. Since both of calcium and yttrium are elements strong against plasma, the etch rate in plasma exposure for the deposited secondary phase is different from that for alumina crystal grains, so that a secondary phase part (Ca—Y phase) remains as a projection, which is highly likely to become a particle. In addition, in manufacturing of the alumina-based sintered body, if calcium is contained, grain growth of alumina crystal grains is promoted, so that a secondary phase is readily formed. In this regard, in the alumina-based sintered body of the present embodiment, the content of calcium is as small as not greater than 100 ppm. Thus, deposition of a secondary phase having a composition different from the base material can be suppressed, whereby production of particles can be suppressed.

The grain sizes of alumina crystal grains in the alumina-based sintered body can be measured by the intercept method. Specifically, a fracture cross-section of the alumina-based sintered body is observed by an SEM (Scanning Electron Microscope), a line having a length L is drawn on an obtained secondary electron image, and then a number n of grains crossed by the line is measured. Here, a grain in which each end of the line is present is counted as 0.5. Then, an average grain size D (μm) is calculated by the following Expression (1).

$$D = 1.5 \times L/n \tag{1}$$

In the present embodiment, an arbitrary number of lines each intersecting grains whose number n is 100 or larger are drawn in parallel, to calculate a plurality of average grain sizes D.

When alumina crystal grains grow abnormally, a secondary phase of YAG is deposited. If the average grain size of alumina crystal grains is set to be not greater than 6 μm, production of a secondary phase can be suppressed, so that formation of a projecting part in plasma exposure can be suppressed. Thus, production of particles can be suppressed.

In the alumina-based sintered body of the present embodiment, preferably, there is no peak corresponding to a lattice plane interval of 2.6 Å to 2.9 Å in a measurement result by an X-ray diffraction method. That is, the maximum peak of YAG is not detected by an X-ray diffraction method for the alumina-based sintered body. Here, YAG has the maximum peak in a crystal orientation (3, 1, 1), which is a peak corresponding to a interplanar spacing of 2.6 Å to 2.9 Å. In such an alumina-based sintered body, YAG is hardly deposited, and thus production of particles can be suppressed.

Preferably, when a surface of the alumina-based sintered body of the present embodiment is observed in an area of 1.2 $mm^2$ by a scanning electron microscope, a phase containing calcium (Ca) and yttrium (Y) and having an area of not smaller than 10 $\mu m^2$ is present at not more than one location. In such an alumina-based sintered body, deposition of a secondary phase containing calcium (Ca) and yttrium (Y) is suppressed, and thus production of particles can be suppressed.

The density of the alumina-based sintered body of the present embodiment is not particularly limited, but is preferably not smaller than 3.96 $g/cm^3$. In such an alumina-based sintered body, the number of pores (voids) is small and thus production of particles can be suppressed. The density of the alumina-based sintered body can be measured by an Archimedes method (JIS R 1634). The density of the alumina-based sintered body is preferably close to 4.0 $g/cm^3$ which is a theoretical density of alumina.

FIG. 1 is a process diagram showing a manufacturing method for the alumina-based sintered body. In the manufacturing method for the alumina-based sintered body of the present embodiment, a process is performed in the order of a blending and spray drying step P1, a degreasing step P2, and then a hot pressing step P3. First, in the blending and spray drying step P1, an inorganic component and a binder dispersant are added into a solvent and then crushing and mixing are performed by a ball mill. The inorganic component is obtained by adding an aid material such as yttria ($Y_2O_3$) or spinel ($MgAl_2O_4$) to alumina ($Al_2O_3$). Spinel is added for suppressing grain growth of alumina. A slurry obtained by the ball mill is dried through spray drying, to prepare granules.

In the degreasing step P2, the granules obtained in the blending and spray drying step P1 are subjected to uniaxial press molding (approximately 10 MPa) and cold isostatic pressing (CIP) (approximately 150 MPa), and the resultant pressed body is degreased at 500° C. to 800° C.

In the hot pressing step P3, the degreased body obtained in the degreasing step P2 is subjected to hot pressing at 1300° C. to 1625° C. under an inert atmosphere (Ar, vacuum, or the like). Thus, the alumina-based sintered body is manufactured. In hot pressing, since a pressure is applied during firing, as compared to atmospheric firing, firing can be performed while grains are compressed, so that densification can be promoted and pores at grain boundaries are readily decreased. In addition, since the contact areas between grains become large, a sintering process can be finished in a shorter period as compared to atmospheric firing.

The alumina-based sintered body of the present embodiment can be used for a semiconductor-manufacturing-apparatus member, a semiconductor manufacturing apparatus, a retention apparatus, an electrostatic chuck, apparatuses including these, and the like.

EXAMPLES

The present disclosure will be described more specifically, using Examples.

FIG. 2 is a table showing an evaluation result for samples 1 to 18. Using the samples 1 to 18 of the alumina-based sintered body different in manufacturing conditions, a sintered density, an average grain size, a calcium amount, and presence/absence of a Ca—Y phase and a YAG phase were evaluated.

1. Manufacturing of Samples

The samples 1 to 18 were manufactured by the manufacturing method in the above embodiment. These samples were different from each other in the addition amounts of yttria and spinel and whether or not a dispersant was added in the blending and spray drying step P1, and the firing temperature and the firing period in the hot pressing step P3.

As the addition amount (ppm) of Y in FIG. 2, the addition amount of yttrium is calculated from the addition amount of yttria. The content (ppm) of yttrium in the alumina-based sintered body is substantially equal to the addition amount (ppm) of yttrium. The content of yttrium can be calculated by performing elemental analysis using ICP optical emission spectrometry for the alumina-based sintered body. However, since there are sampling variations of approximately ±20%, measurement is performed for samples whose number is not smaller than 5, and the average value thereof is used. Thus, the content of yttrium (amount obtained by ICP optical emission spectrometry) converges to the addition amount of yttrium.

In the degreasing step P2, degreasing was performed at 500° C. in the atmosphere. In the hot pressing step P3, the samples 1 to 15, 17, and 18 were pressed at a hot pressing pressure of 20 MPa, and the sample 16 was pressed at a hot pressing pressure of 60 MPa. The firing temperature and the firing period will be described later.

Using a manufacturing condition for the sample 4 (Y addition amount: 174 ppm, firing temperature: 1550° C., firing period: 4 hours) as a standard condition, the addition amount of yttrium, the firing temperature, the firing period, and whether or not a dispersant was added, were changed. Here, the added dispersant contained calcium, and it is considered that calcium promotes growth of alumina crystal grains. In Examples, the dispersant was added for the samples 13 and 14 and the dispersant was not added for the other samples. The dispersant containing calcium has an effect of suppressing aggregation of inorganic components in the solvent. In the samples 1 to 18, in a case of adding the dispersant, water was used as the solvent. In a case of not adding the dispersant, an organic solvent (here, ethanol) was used as the solvent, to suppress aggregation. In another Example, a dispersant not containing calcium may be used and the solvent may be water.

In addition, as the organic solvent, various known organic solvents other than the above one may be used.

2. Measurement Method

The densities of the alumina-based sintered bodies were measured by the Archimedes method (JIS R 1634).

The average grain size of alumina crystal grains in each alumina-based sintered body was calculated using grain sizes measured by the intercept method as described above.

The content of calcium was calculated by ICP optical emission spectrometry. Since there are sampling variations in measurement, the average value of 5 or more measurements was used. Presence/absence of a Ca—Y phase was determined by observing SEM images of a fracture cross-section and a mirror-polished surface of each sample and identifying contained elements using energy-dispersive X-ray spectroscopy (EDS).

Presence/absence of a YAG phase was determined by an X-ray diffraction (XRD) method.

3. Measurement Result

Figure 3A:
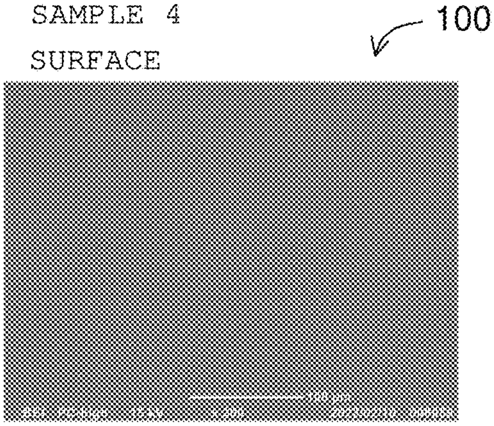
FIG. 3A Views showing a SEM image of sample 4.
Figure 3B:
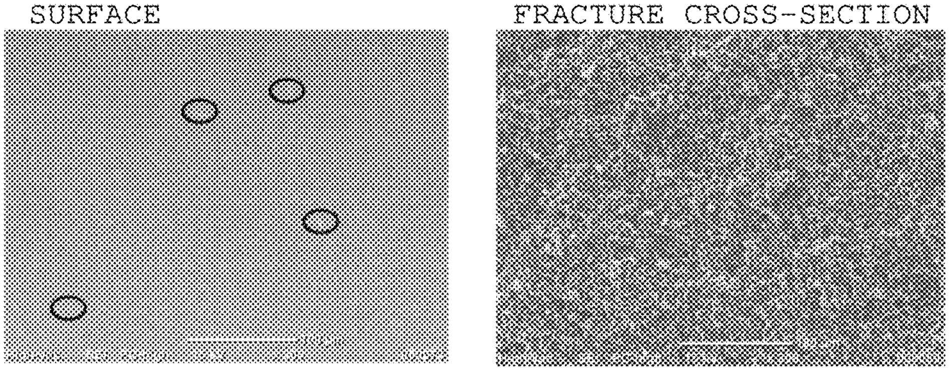
FIG. 3B Views showing SEM images of sample 13.
Figure 3C:
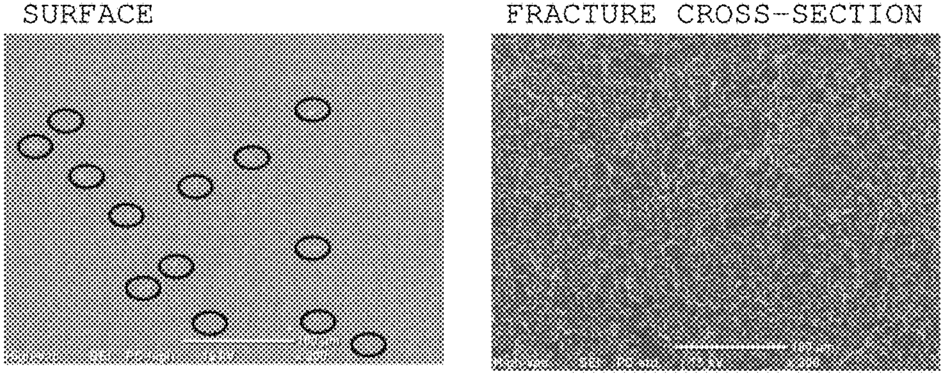
FIG. 3C Views showing SEM images of sample 15.
Figure 3D:
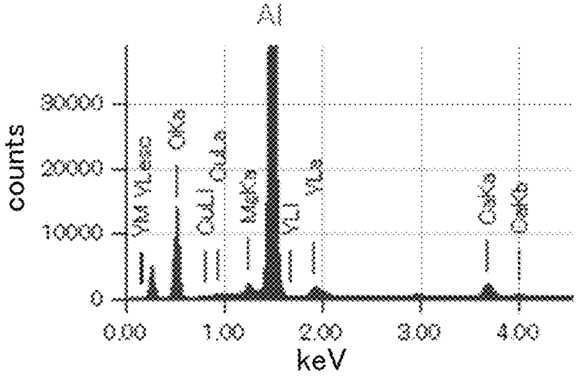
FIG. 3D Views showing a result of EDS for the sample 13.
Figure 5:
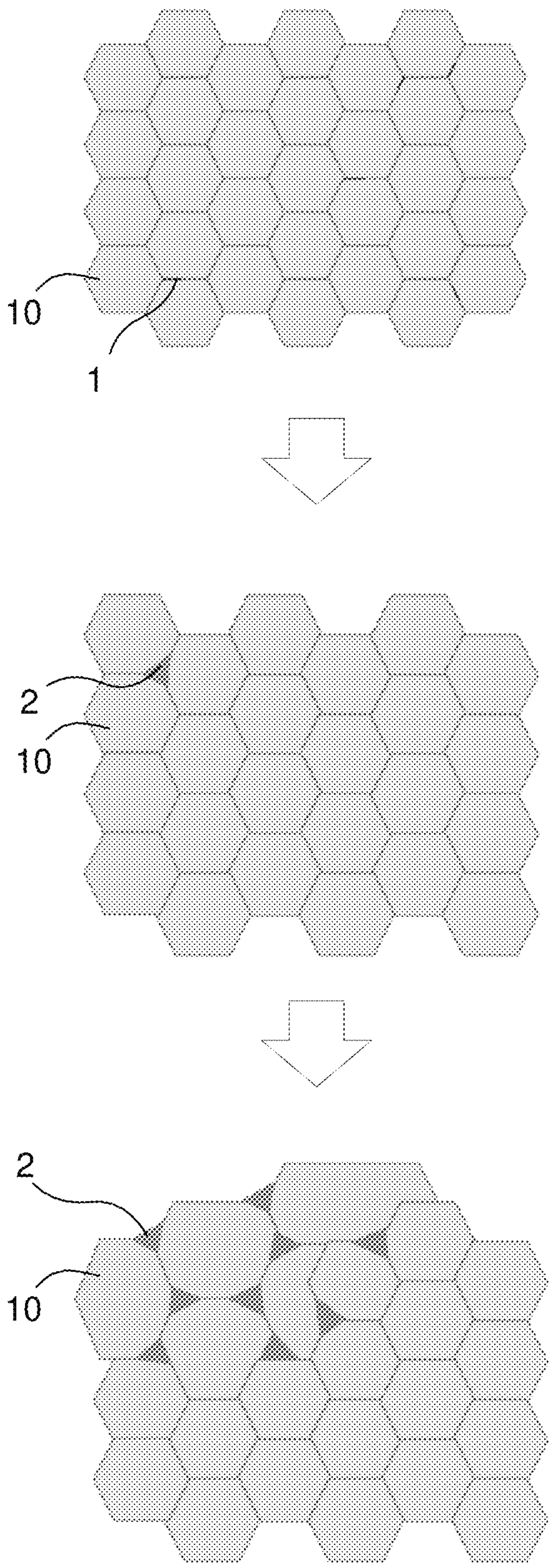
FIG. 5 Views conceptually illustrating a mechanism of secondary phase deposition.

FIGS. 3A to 3D are views showing an example of presence/absence of a Ca—Y phase in samples. FIG. 3A shows a SEM image of the sample 4, FIG. 3B shows a SEM image of the sample 13, FIG. 3C shows the SEM image of the sample 15, and FIG. 3D shows a result of EDS for the sample 13. In FIG. 3D, a spectrum is shown at the left and an amount determination result is shown at the right. FIGS. 4A and 4B are views showing difference in deposition of a secondary phase depending on a firing period. FIG. 4A shows SEM images of sample 7 and 8. FIG. 4B shows results of XRD of the sample 7 and 8. FIG. 5 is views schematically illustrating a mechanism of secondary phase deposition. FIGS. 6A and 6B are views showing examples of SEM images of the samples after plasma irradiation.

The sample 4 (alumina-based sintered body 100) manufactured under the standard condition satisfies the following requirements [1] to [6](FIG. 2).

[1] Containing not smaller than 90 ppm and not greater than 265 ppm of yttrium (Y).

[2] Containing not greater than 100 ppm of calcium (Ca).

[3] The average grain size of alumina crystal grains is not greater than 6 μm.

[4] In a measurement result by the X-ray diffraction method for the alumina-based sintered body, there is no peak corresponding to a interplanar spacing of 2.6 Å to 2.9 Å. That is, there is no YAG phase.

[5] When the surface of the alumina-based sintered body is observed in an area of 1.2 $mm^2$ by a scanning electron microscope, a phase containing calcium (Ca) and yttrium (Y) and having an area of not smaller 10 $\mu m^2$ is present at not more than one location. That is, there is no Ca—Y phase.

[6] The density of the alumina-based sintered body is not smaller than 3.96 $g/cm^3$.

FIG. 3A is the SEM image of the (mirror-polished) surface of the sample 4. As shown in FIG. 3A, deposition of a secondary phase is not confirmed on the SEM image of the sample 4.

The samples 3, 5 to 7, 17, and 18 were manufactured with only the firing temperatures changed as compared to the sample 4. The firing temperatures for the samples 3, 17, and 18 are lower than that for the sample 4, and the samples 3, 17, and 18 were manufactured at firing temperatures of 1525° C., 1450° C., and 1490° C., respectively. The firing temperatures for the samples 5 to 7 are higher than that for the sample 4, and the samples 5 to 7 were manufactured at firing temperatures of 1575° C., 1600° C., and 1625° C., respectively. In the sample 3, the sintered density is the same as that of the sample 4, and the average grain size is smaller than that of the sample 4. In the samples 5 and 6, the sintered densities are smaller than that of the sample 4, and the average grain sizes are greater than that of the sample 4. In the sample 7, the sintered density and the average grain size are greater than those of the sample 4. In the samples 17 and 18, the sintered densities and the average grain sizes are smaller than those of the sample 4. The samples 3, 5 to 7, 17, and 18 also satisfy the above requirements [1] to [6]. That is, a Ca—Y phase and a YAG phase (secondary phases) are not formed. From the results of the samples 3 to 7, 17, and 18, it is found that, the higher the firing temperature is, the greater the average grain size is.

In the sample 2, the addition amount of Mg (added as spinel) is smaller than that of the sample 4, and the other conditions are the same as those for the sample 4. In the sample 2, the sintered density is greater than that of the sample 4, and the average grain size is the same as that of the sample 4. The sample 2 also satisfies the above requirements [1] to [6]. That is, a Ca—Y phase and a YAG phase (secondary phases) are not formed.

In the sample 1, the addition amount of yttrium is 87 ppm which is smaller than that of the sample 4, and the other conditions are the same as that for the sample 4. In the sample 1, the sintered density is the same as that of the sample 4, and the average grain size is smaller than that of the sample 4. The sample 1 also satisfies the above requirements [1] to [6]. That is, a Ca—Y phase and a YAG phase (secondary phases) are not formed.

In the sample 8, the firing temperature is 1625° C. which is higher than that for the sample 4, and the firing period is significantly increased to 12 hours as compared to the sample 4. The other conditions are the same as those for the sample 4. In the sample 8, the average grain size of alumina crystal grains is 7.5 μm which is greater than that of the sample 4, i.e., a YAG phase (secondary phase) is formed. The sample 8 does not satisfy the requirements [3] and [4] among the above requirements [1] to [6].

In the sample 16, the firing temperature is 1300° C. which is lower than that for the sample 4, and the hot pressing pressure is 60 MPa which is higher than that for the sample 4. The other conditions are the same as those for the sample 4. In the sample 16, the sintered density and the average grain size are smaller than those of the sample 4. The sample 16 also satisfies the above requirements [1] to [6]. That is, a Ca—Y phase and a YAG phase (secondary phases) are not formed. As described above, the lower the firing temperature is, the smaller the average grain size of alumina crystal grains is, but when the firing temperature is extremely low, the material is not sintered and therefore the hot pressing pressure is set to be high for the sample 16.

FIG. 4A shows SEM images (channeling contrast images) of the sample 7 and the sample 8. In the sample 7 and the sample 8, the firing periods are different, i.e., four hours and eight hours, but the other conditions are the same. As shown in FIG. 4A, in the sample 7, the deposition amount of secondary phases was small and secondary phases were confirmed only at two locations in a viewing range of 22.5 $mm^2$. On the other hand, in the sample 8, the deposition amount of secondary phases is large and secondary phases were confirmed at fourteen locations in a viewing field of 22.5 $mm^2$. It has been confirmed that increasing the firing period from four hours to twelve hours promotes growth of alumina crystal grains and increases secondary phases.

FIG. 4B shows a result of XRD for the samples 7 and 8. In the sample 8, peaks matching YAG were confirmed. Therefore, it was determined that a secondary phase in the sample 8 was YAG. Here, the wavelength of the X ray is 1.5418 Å (characteristic X-ray of Cu Kα).

It is considered that the secondary phase is deposited as follows. As shown in the upper stage in FIG. 5, at the start of the firing step (hot pressing step P3), yttrium 1 is present at an alumina crystal grain boundary. As the grain boundary area is reduced along with growth of an alumina crystal grain 10, a secondary phase 2 is deposited (middle stage in FIG. 5). Abnormal grain growth occurs by dispersion through the secondary phase, and the grain boundary area is further reduced by abnormal grain growth, so that secondary phases are produced in a clustered manner (lower stage in FIG. 5).

As shown in FIG. 2, in the samples 9 to 11, the addition amounts of yttrium are 209 ppm, 261 ppm, and 348 ppm, respectively, which are greater than that of the sample 4, and the other conditions are the same as those for the sample 4. In the sample 9, the sintered density is the same as that of the sample 4, and the average grain size is slightly greater than that of the sample 4. The sample 9 satisfies the above requirements [1] to [6]. In the sample 10, the sintered density is slightly greater than that of the sample 4, and the average grain size is the same as that of the sample 4. The sample 10 satisfies the above requirements [1] to [6]. That is, in the samples 9 and 10, secondary phases which are a Ca—Y phase and a YAG phase, are not formed.

In the sample 11, the sintered density is the same as that of the sample 4, the average grain size of alumina crystal grains is slightly greater than that of the sample 4, and a YAG phase (secondary phase) is formed. The sample 11 does not satisfy the requirement [4] among the above requirements [1] to [6]. In the sample 11, since the addition amount of yttrium was great, a part of yttrium could not exist at grain boundaries of alumina crystal grains and thus was deposited as a secondary phase.

In the sample 12, the addition amount of magnesium is smaller than that of the sample 4, but the other conditions are the same as those for the sample 4. In the sample 12, the sintered density is slightly greater than that of the sample 4, and the average grain size is slightly smaller than that of the sample 4. The sample 12 also satisfies the above requirements [1] to [6]. That is, secondary phases which are a Ca—Y phase and a YAG phase, are not formed.

In the samples 13 and 14, the dispersant containing calcium is added, but the other conditions are the same as those for the sample 4. In the sample 13, the content of calcium is 103 ppm, the sintered density and the average grain size are slightly greater than those of the sample 4, and a Ca—Y phase (secondary phase) is formed. In the SEM image of the sample surface shown at the left in FIG. 3B, secondary phases were confirmed at locations enclosed by circles. In addition, from the result of EDS for the sample 13, deposition of calcium could be confirmed (FIG. 3D). The sample 13 does not satisfy the above requirements [2] and [5].

In the sample 14, the content of calcium is 175 ppm, the sintered density is slightly greater than that of the sample 4, and the average grain size is 7.2 μm which is greater than that of the sample 4. In the sample 14, both of secondary phases which are a Ca—Y phase and a YAG phase are formed. That is, the sample 13 does not satisfy the above requirements [2] to [5].

In the sample 15, the addition amount of yttrium is as great as not smaller than four times that of the sample 4 and the firing temperature is also as high as 1600° C. The other conditions are the same as those for the sample 4. In the sample 14, the sintered density is the same as that of the sample 4, but the average grain size is 6.2 μm which is greater than that of the sample 4 and a YAG phase (secondary phase) is formed. In the SEM image of the sample surface shown at the left in FIG. 3C, secondary phases were confirmed at locations enclosed by circles. The sample 15 does not satisfy the above requirements [3] and [4].

FIG. 6 shows examples of SEM images after plasma irradiation was performed on the samples under the following condition.

Plasma irradiation
Method: ICP
Gas: $CF_4$+$O_2$
Source RF: 1000 W
Bias RF: 300 W
Irradiation period: 5 minutes In the sample 4 shown in FIG. 6A, as described above, secondary phases (YAG phase and Ca—Y phase) are not formed, and projections are not formed on the surface after plasma irradiation. On the other hand, in the sample 15 shown in FIG. 6B, as described above, a secondary phase (YAG phase) is formed, and a secondary phase 2 (YAG phase) is left in a projecting shape on the surface after plasma irradiation.

As described above, the samples 1 to 7, 9, 10, 12, and 16 to 18 satisfy all the above requirements [1] to [6], and correspond to Examples of the alumina-based sintered body 100 of the above embodiment. Since these samples do not have secondary phases, production of particles can be suppressed when these samples are exposed to plasma.

Second Embodiment

Figure 7:
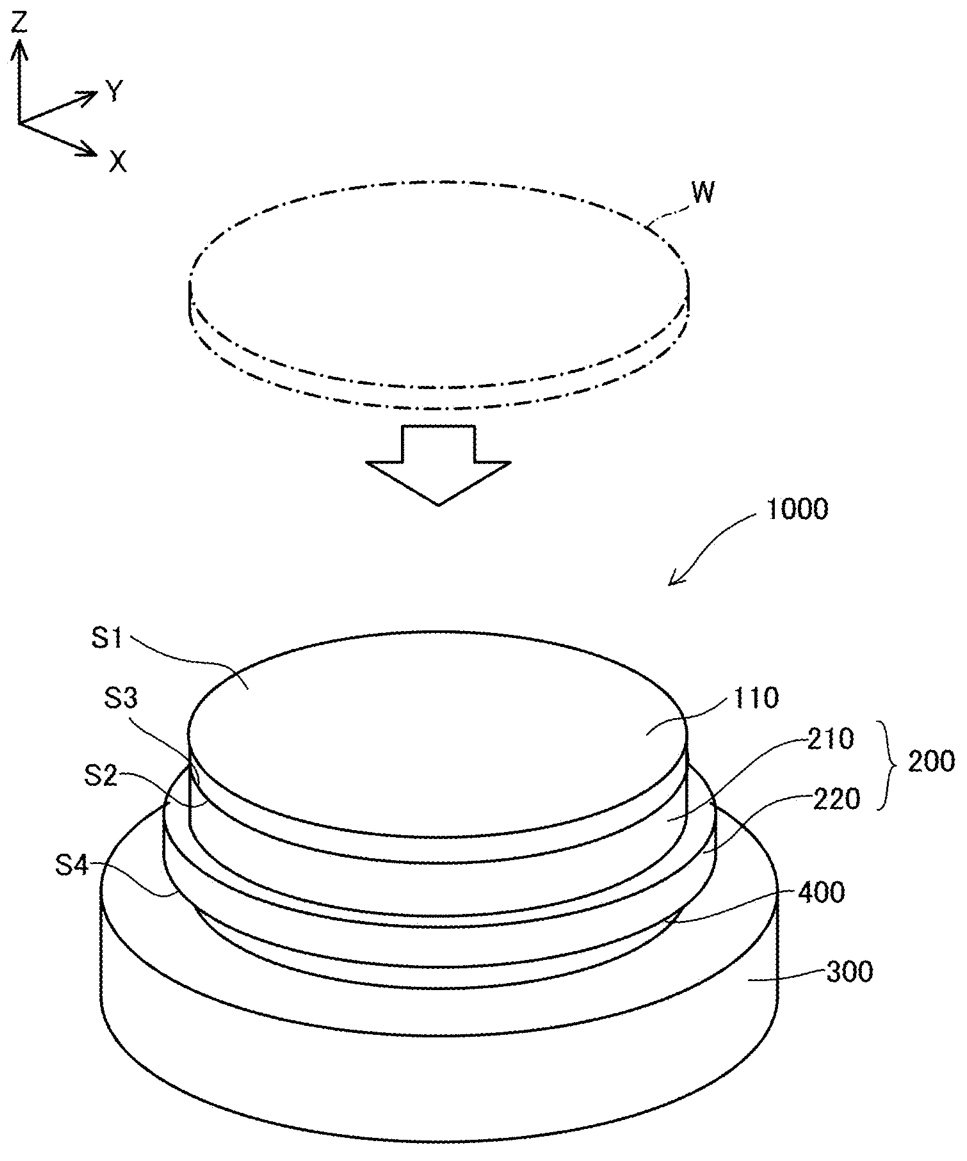
FIG. 7 Perspective view schematically showing the exterior structure of an electrostatic chuck of a second embodiment.
Figure 8:
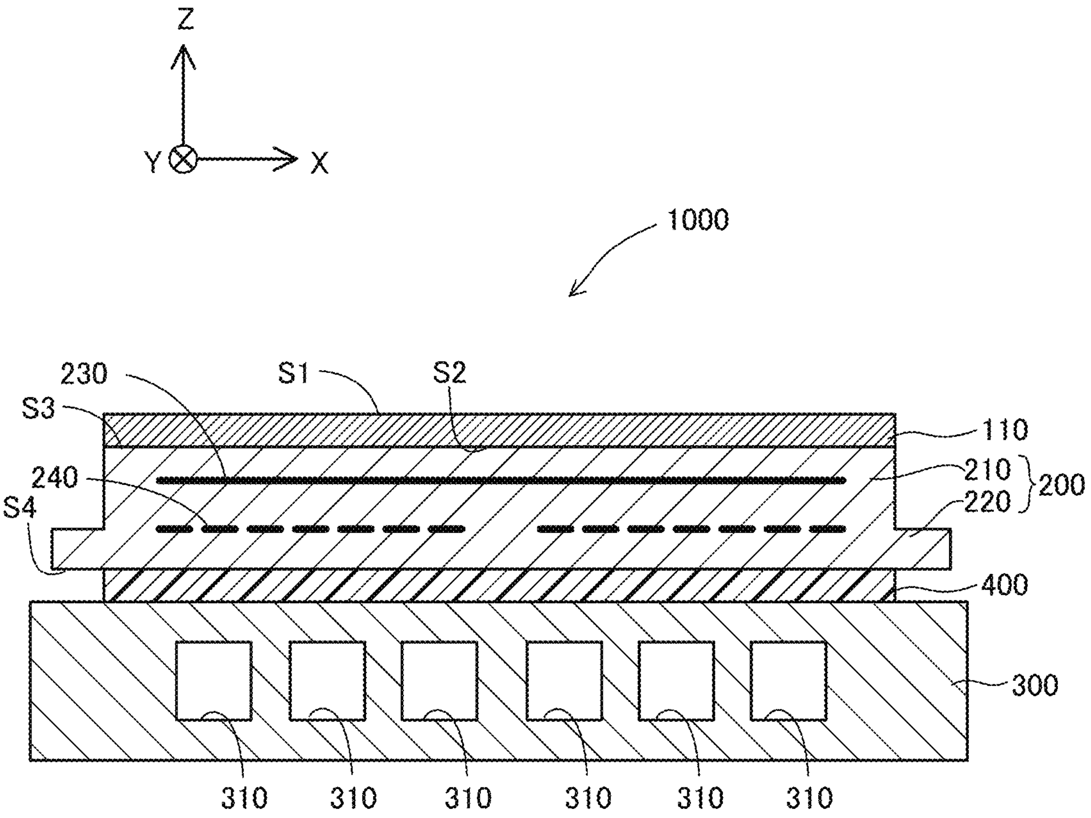
FIG. 8 View schematically illustrating an XZ cross-section structure of the electrostatic chuck.

FIG. 7 is a perspective view schematically showing the exterior structure of an electrostatic chuck 1000 according to a second embodiment of the present disclosure. FIG. 8 is a view schematically illustrating an XZ cross-section structure of the electrostatic chuck 1000. In FIG. 7 and FIG. 8, X, Y, and Z axes orthogonal to each other are shown for specifying directions. In FIG. 8, the Y-axis positive direction is a direction toward the back side of the drawing sheet. In the description, for convenience sake, the Z-axis positive direction is referred to as an upward direction, and the Z-axis negative direction is referred to as a downward direction. However, in actuality, the electrostatic chuck 1000 may be placed with directions different from the above directions.

The electrostatic chuck 1000 is a device that attracts and retains a target (e.g., wafer W) by an electrostatic attraction force, and is used for fixing the wafer W in a vacuum chamber of a semiconductor manufacturing apparatus, for example. The electrostatic chuck 1000 includes a first layer 110, a second layer 200, a cooling portion 300, and a joining portion 400 which are provided so as to be arranged in the up-down direction (Z-axis direction), and the joining portion 400 is provided between the second layer 200 and the cooling portion 300 and joins the second layer 200 and the cooling portion 300 to each other.

The first layer 110 is a plate-shaped member having a circular-planar-shaped first surface S1 and a circular-planar-shaped second surface S2 which is a surface opposite to the first surface S1. In the present embodiment, the first surface S1 of the first layer 110 serves as a placement surface at which the wafer W is to be placed. The first layer 110 is formed by the alumina-based sintered body 100 of the first embodiment. The porosity of the first layer 110 is not greater than 1%.

The second layer 200 is a plate-shaped member having a third surface S3 and a fourth surface S4 which is a surface opposite to the third surface S3. the second layer 200 comprises a second layer main body 210 (FIG. 1) which is a plate-like member having a third surface S3 having an approximately circular planar shape, and a flange portion 220 (FIG. 1) protruding from the second layer main body 210, and is a plate-like member whose diameter expands stepwise downward (towards the negative Z-axis direction) as a whole.

As shown in the drawing, the third surface S3 has substantially the same planar shape as the second surface S2, and the fourth surface S4 has an expanded diameter as compared to the third surface S3.

The second layer 200 is a densified body containing ceramic called fine ceramic or new ceramic as a main component. The porosity of the second layer 200 is greater than the porosity of the first layer 110 and is 1% to 5%. As the ceramic, various ceramics such as alumina ($Al_2O_3$), aluminum nitride (AlN), zirconia ($ZrO_2$), silicon carbide (SiC), zircon ($ZrO_2 \cdot SiO_2$), mullite ($3Al_2O_3 \cdot 2SiO_2$), or silicon nitride ($Si_3N_4$), may be used. Using, as the main component of the second layer 200, alumina which is the same as the main component of the first layer 110 can reduce the difference between the thermal expansion coefficients of the first layer 110 and the second layer 200, and thus is preferable.

Inside the second layer 200, a chuck electrode 230 (FIG. 8) made of an electrically conductive material (e.g., tungsten or molybdenum) is provided. As seen in the Z-axis direction, the shape of the chuck electrode 230 is a circular shape, for example. When voltage is applied to the chuck electrode 230 from a power supply (not shown), an electrostatic attraction force is generated, and by the electrostatic attraction force, the wafer W is attracted and fixed to the first surface S1 of the first layer 110.

In addition, inside the second layer 200, a heater 240 (FIG. 8) having a spiral shape as seen in the Z-axis direction is provided on the lower side (Z-axis negative side) of the chuck electrode 230. In the present embodiment, the heater 240 is a metallization layer made of tungsten, molybdenum, or the like. The shape of the heater 240 is not limited to that in the present embodiment, and may be, for example, a disk shape or the like. In another embodiment, the second layer 200 may not include the heater 240.

In the present embodiment, the first layer 110 and the second layer 200 are joined to each other by diffusion bonding. In another embodiment, the first layer 110 and the second layer 200 may be joined to each other using the same material (i.e., shared material) as the first layer 110 or the second layer 200. By adhering the first layer 110 and the second layer 200 to each other without using an adhesive containing an organic material as a main component, reduction in heat transfer between the first layer 110 and the cooling portion 300 can be suppressed.

The cooling portion 300 is a plate-shaped member having a circular planar shape and having a greater diameter than the fourth surface S4 of the second layer 200. The cooling portion 300 is made of metal having a high thermal conductivity. For example, aluminum, titanium, molybdenum, an alloy containing any of these materials as a main component, or the like may be used. The diameter of the cooling portion 300 is approximately 220 mm to 550 mm (normally, 220 mm to 350 mm) for example, and the thickness of the cooling portion 300 is approximately 20 mm to 40 mm, for example.

Inside the cooling portion 300, a coolant path 310 (FIG. 8) is formed. When the wafer W retained at the first layer 110 of the electrostatic chuck 1000 is worked using plasma, heat enters the wafer W from plasma, so that the temperature of the wafer W increases. As a coolant (e.g., fluorine-based inert liquid or water) flows through the coolant path 310 formed in the cooling portion 300, the cooling portion 300 is cooled. By heat transfer between the cooling portion 300 and the first layer 110 through the second layer 200 and the joining portion 400, the first layer 110 is cooled, so that the wafer W retained at the first surface S1 of the first layer 110 is cooled. Thus, temperature control for the wafer W is achieved. In another embodiment, the cooling portion may be cooled from outside without having a coolant path therein.

The joining portion 400 is a plate-shaped member having a circular planar shape and having a diameter equal to that of the first surface S1, and joins the second layer 200 and the cooling portion 300 to each other. The joining portion 400 is formed by an adhesive containing an organic material as a main component, and as the organic material, for example, silicone, acrylic, polyimide, or the like may be used.

In the electrostatic chuck 1000 of the present embodiment, the placement surface (first surface S1) at which the wafer W is to be placed is formed by the alumina-based sintered body 100 of the first embodiment. In a case of working the wafer W retained at the electrostatic chuck 1000 using plasma, the first layer 110 is more exposed to plasma than the second layer 200 and the cooling portion 300. In the electrostatic chuck 1000 of the present embodiment, the alumina-based sintered body 100 of the first embodiment is provided at such a part that is more exposed to plasma, and the alumina-based sintered body 100 can suppress production of particles when being exposed to plasma. Thus, using the electrostatic chuck 1000 of the present embodiment can suppress production of particles when the wafer W is subjected to plasma processing.

Modifications of Embodiments

The present disclosure is not limited to the above embodiments and may be implemented in various embodiments without deviating from the gist of the present disclosure. For example, the following modifications are also possible.

The manufacturing method for the alumina-based sintered body is not limited to those in the above embodiments. The kind of the dispersant, the addition amount of the dispersant, the firing method, the firing atmosphere, the firing temperature, the hot pressing pressure, or the like may be changed as appropriate, whereby it is possible to manufacture an alumina-based sintered body which contains not smaller than 90 ppm and not greater than 265 ppm of yttrium (Y), and not greater than 100 ppm of calcium (Ca), and in which the average grain size of alumina crystal grains is not greater than 6 μm. The alumina-based sintered body may be manufactured by another known method such as gel casting.

In the above embodiments, an impurity other than yttrium, calcium, and magnesium may be contained. However, not containing another impurity can more suppress deposition of a secondary phase and thus is preferable.

In the second embodiment, the example in which the entirety of the first surface S1 of the first layer 110 is formed by the alumina-based sintered body 100 of the first embodiment has been shown. However, at least a part of the first surface S1 of the first layer 110 may be formed by the alumina-based sintered body 100 of the first embodiment. For example, a part including a portion to be exposed without being covered by the wafer W when the wafer W is placed at the first surface S1 may be formed by the alumina-based sintered body 100 of the first embodiment. Even in this case, production of particles can be suppressed.

In the second embodiment, the electrostatic chuck 1000 may have a flow path through which gas such as helium (He) gas flows between the attracted wafer W and the first surface S1.

While the present disclosure has been described above using embodiments, Examples, and modifications, the embodiments described above are merely for facilitating the understanding of the present disclosure and are not intended to limit the present disclosure. The present disclosure may be subjected to change or modification without deviating from the gist thereof and the scope of the claims, and the present disclosure includes equivalents thereof. Further, such technical features can be deleted as appropriate if not described as being essential in the present specification.

The present disclosure can be implemented as in the following Examples.

Example 1

An alumina-based sintered body containing $Al_2O_3$ as a main component, wherein the alumina-based sintered body contains not smaller than 90 ppm and not greater than 265 ppm of yttrium (Y), and not greater than 100 ppm of calcium (Ca), and an average grain size of alumina crystal grains is not greater than 6 μm.

Example 2

The alumina-based sintered body in accordance with example 1, wherein in a measurement result by an X-ray diffraction method for the alumina-based sintered body, there is no peak corresponding to a interplanar spacing of 2.6 Å to 2.9 Å.

Example 3

The alumina-based sintered body in accordance with example 1 or 2, wherein when a surface of the alumina-based sintered body is observed in an area of 1.2 $mm^2$ by a scanning electron microscope, a phase containing calcium (Ca) and yttrium (Y) and having an area of not smaller than 10 $\mu m^2$ is present at not more than one location.

Example 4

The alumina-based sintered body in accordance with any one of examples 1 to 3, wherein a density of the alumina-based sintered body is not smaller than 3.96 $g/cm^3$.

Example 5

An electrostatic chuck for retaining a target, the electrostatic chuck comprising:

a plate-shaped first layer having a first surface at which the target is to be placed, and a second surface which is a surface opposite to the first surface; and a plate-shaped second layer having a chuck electrode therein and provided on the second surface side of the first layer, wherein at least a part of the first surface of the first layer is formed by the alumina-based sintered body in accordance with any one of examples 1 to 4.

DESCRIPTION OF REFERENCE NUMERALS

1: yttrium
2: secondary phase
10: alumina crystal grain
100: alumina-based sintered body
110: first layer
200: second layer
210: second layer body
220: flange
300: cooling portion
400: joining portion
1000: electrostatic chuck
S1: first surface
S2: second surface
S3: third surface
S4: fourth surface

What is claimed is:

1. An alumina-based sintered body containing $Al_2O_3$ as a main component, wherein the alumina-based sintered body contains not smaller than 90 ppm and not greater than 265 ppm of yttrium (Y), and greater than zero and not greater than 100 ppm of calcium (Ca), and an average grain size of alumina crystal grains is not greater than 6 μm.

2. The alumina-based sintered body in accordance with claim 1, wherein in a measurement result by an X-ray diffraction method for the alumina-based sintered body, there is no peak corresponding to a interplanar spacing of 2.6 Å to 2.9 Å.

3. The alumina-based sintered body in accordance with claim 1, wherein when a surface of the alumina-based sintered body is observed in an area of 1.2 $mm^2$ by a scanning electron microscope, a phase containing calcium (Ca) and yttrium (Y) and having an area of not smaller than 10 $\mu m^2$ is present at not more than one location.

4. The alumina-based sintered body in accordance with claim 1, wherein a density of the alumina-based sintered body is not smaller than 3.96 $g/cm^3$.

5. An electrostatic chuck for retaining a target, the electrostatic chuck comprising:

a plate-shaped first layer having a first surface at which the target is to be placed, and a second surface which is a surface opposite to the first surface; and a plate-shaped second layer having a chuck electrode therein and provided on the second surface side of the first layer, wherein at least a part of the first surface of the first layer is formed by the alumina-based sintered body in accordance with claim 1.

6. An electrostatic chuck for retaining a target, the electrostatic chuck comprising:

a plate-shaped first layer having a first surface at which the target is to be placed, and a second surface which is a surface opposite to the first surface; and a plate-shaped second layer having a chuck electrode therein and provided on the second surface side of the first layer, wherein at least a part of the first surface of the first layer is formed by the alumina-based sintered body in accordance with claim 2.

7. An electrostatic chuck for retaining a target, the electrostatic chuck comprising:

a plate-shaped first layer having a first surface at which the target is to be placed, and a second surface which is a surface opposite to the first surface; and a plate-shaped second layer having a chuck electrode therein and provided on the second surface side of the first layer, wherein at least a part of the first surface of the first layer is formed by the alumina-based sintered body in accordance with claim 3.

8. An electrostatic chuck for retaining a target, the electrostatic chuck comprising:

a plate-shaped first layer having a first surface at which the target is to be placed, and a second surface which is a surface opposite to the first surface; and a plate-shaped second layer having a chuck electrode therein and provided on the second surface side of the first layer, wherein at least a part of the first surface of the first layer is formed by the alumina-based sintered body in accordance with claim 4.

* * * * *